(12) United States Patent
Heath

(10) Patent No.: US 7,369,604 B2
(45) Date of Patent: May 6, 2008

(54) TIME CORRELATION OF DATA ACQUISITION SAMPLES FROM INDEPENDENT SYSTEMS IN A LOGIC ANALYZER

(75) Inventor: Robert J. Heath, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 537 days.

(21) Appl. No.: 10/259,372

(22) Filed: Sep. 27, 2002

(65) Prior Publication Data
US 2003/0063693 A1 Apr. 3, 2003

Related U.S. Application Data

(60) Provisional application No. 60/326,484, filed on Oct. 1, 2001.

(51) Int. Cl.
*H04B 3/46* (2006.01)
(52) U.S. Cl. .......................... 375/224; 702/66; 702/70; 702/187

(58) Field of Classification Search ................ 375/224, 375/228; 714/724; 702/189, 79, 108, 121, 702/125, 66, 70, 187; 324/76.11, 537, 754, 324/755, 759, 764
See application file for complete search history.

(56) References Cited

U.S. PATENT DOCUMENTS

| 4,924,468 A | * | 5/1990 | Horak et al. ................ 714/724 |
| 5,162,728 A | * | 11/1992 | Huppenthal ................. 324/758 |
| 5,854,996 A | * | 12/1998 | Overhage et al. ........... 702/189 |

OTHER PUBLICATIONS

Agilent product Note, Using the Agilent Technologies 16700 Series Logic Analysis System with the Xilinix ChipScope ILAm Agilet Technologies, 2000.*

* cited by examiner

*Primary Examiner*—Chieh M. Fan
*Assistant Examiner*—Jaison Joseph
(74) *Attorney, Agent, or Firm*—Thomas F. Lenihan; Francis I. Gray

(57) ABSTRACT

Apparatus according to the subject invention includes two independent acquisition systems, wherein one of the two independent acquisition systems acquires the acquisition clock of the other acquisition system along with a signal from a known acquisition reference point. In general, the first independent acquisition system is a logic analyzer, and the second independent acquisition system can be an ILA, a second logic analyzer, an oscilloscope, or other sampling device.

8 Claims, 1 Drawing Sheet

TIME CORRELATION OF DATA ACQUISITION SAMPLES FROM INDEPENDENT SYSTEMS IN A LOGIC ANALYZER

CLAIM FOR PRIORITY

The subject application hereby claims priority from U.S. Provisional Patent Application Ser. No. 60/326,484, entitled, METHOD FOR TIME CORRELATING DATA ACQUISITION SAMPLES FROM INDEPENDENT SYSTEMS NOT UTILIZING A COMMON TIMESTAMP CLOCK NOR REQUIRING A KNOWN FIXED PERIOD SAMPLE CLOCK, (Heath) filed 1 Oct. 2001.

FIELD OF THE INVENTION

The subject invention concerns the field of test and measurement instrumentation in general, and in particular concerns time correlation of data acquisition samples from independent systems in a logic analyzer.

BACKGROUND OF THE INVENTION

A logic analyzer is a test and measurement instrument that acquires data samples from a system under test (also known as a target system or simply a target) over a large number of channels. Logic analyzers typically store a timestamp with each acquisition sample that records the precise time at which that sample was acquired, relative to the beginning of the acquisition process. In typical logic analysis systems, such as the TLA family of Logic Analyzers, manufactured by Tektronix, Inc. of Beaverton, Oreg., the acquisition start signal and timestamp clock are distributed to all acquisition units in the system so that all units act in concert. Thus, when an acquisition is complete, it is possible to sort and display samples from all of the units in an ordered sequence based on the timestamp values stored with each sample. This process is known as Time Correlation.

However, in some instances, it is necessary to use multiple, independent, acquisition systems to acquire data simultaneously. Independent, in this case, means that the acquisition systems do not share both a common start signal and common timestamp clock. As such, the mechanism described above cannot be applied. Nevertheless, it is desirable to be able to present the data acquired by these independent systems in a time-correlated display.

One example of a pair of independent systems that suffer from this problem consists of a logic analyzer in concert with a Xilinx ILA (Integrated Logic Analyzer), manufactured by Xilinx, Inc. of San Jose, Calif. The Xilinx ILA gives users of Xilinx FPGAs (Field Programmable Gate Arrays) the ability to acquire data from internal FPGA nodes and to save that data in memory in the FPGA for later retrieval and display. The user defines a custom ILA for his/her specific application, specifying which nodes to acquire, which nodes to use for triggering, and clocking, and the acquisition buffer depth. The ILA definition is merged with the user's own FPGA source code, and is then programmed into the target component. The logic analyzer gives users visibility of logic signals external to the FPGA while the ILA provides visibility of FPGA internal nodes. It would be desirable for users to be able to view both sets of data in a time-correlated presentation such that relationships between internal and external activity could be analyzed. Yet, these two systems, the ILA and logic analyzer, use independent acquisition clocks and do not share a common start signal. Furthermore, the ILA does not save timestamp information with its samples at all.

Agilent Technologies, Inc. of Palo Alto, Calif., has developed an approach and a tool for time correlation, which enables data acquired by their 16700 series logic analyzer to be time correlated with data from a Xilinx ILA under limited circumstances. In this prior art solution, the ILA trigger signal is routed to one of the FPGA external pins, such that it can be acquired by the logic analyzer along with other external data. A transition on this signal provides a single reference point in the 16700 acquisition corresponding to a known sample in the ILA acquisition. In this prior art solution, the user must specify the period of the clock that is being used to acquire the ILA data It is then possible to calculate effective timestamps for the remaining ILA samples, relative to the known timestamp at the trigger point. This solution is explained in detail in an Agilent product note entitled, Using the Agilent Technologies 16700 Series Logic Analysis System with the Xilinx ChipScope ILA, published in November 2000.

This prior art approach enables the Agilent 16700 to effectively time correlate the data from the ILA with its own acquisition data, but is limited to systems in which the ILA acquisition clock has a regular, fixed and known period. It will not function properly if the acquisition clock is irregular or is qualified (temporarily inhibited) by other system logic. This solution also suffers from drift between the Agilent 16700 timestamp clock and the clock being used for ILA acquisition. The cumulative effect of this drift decreases the accuracy of derived timestamps for the ILA samples as the time interval between the known reference point and any given sample increases. What is needed is a solution that provides time correlation between two independent acquisition systems without requiring the use of a common timestamp clock nor an acquisition clock with a known, fixed, period.

SUMMARY OF THE INVENTION

Apparatus according to the subject invention includes two independent acquisition systems, wherein one of the two independent acquisition systems acquires the acquisition clock of the other acquisition system along with a signal from a known acquisition reference point. In a first embodiment of the invention, the first independent acquisition system is a logic analyzer, and the second independent acquisition system is an ILA. In a second embodiment of the invention, the first independent acquisition system is a logic analyzer, and the second independent acquisition system is a second logic analyzer. In a third embodiment of the invention, the first independent acquisition system is a logic analyzer, and the second independent acquisition system is an oscilloscope.

DETAILED DESCRIPTION OF THE EMBODIMENT

Figure 1:
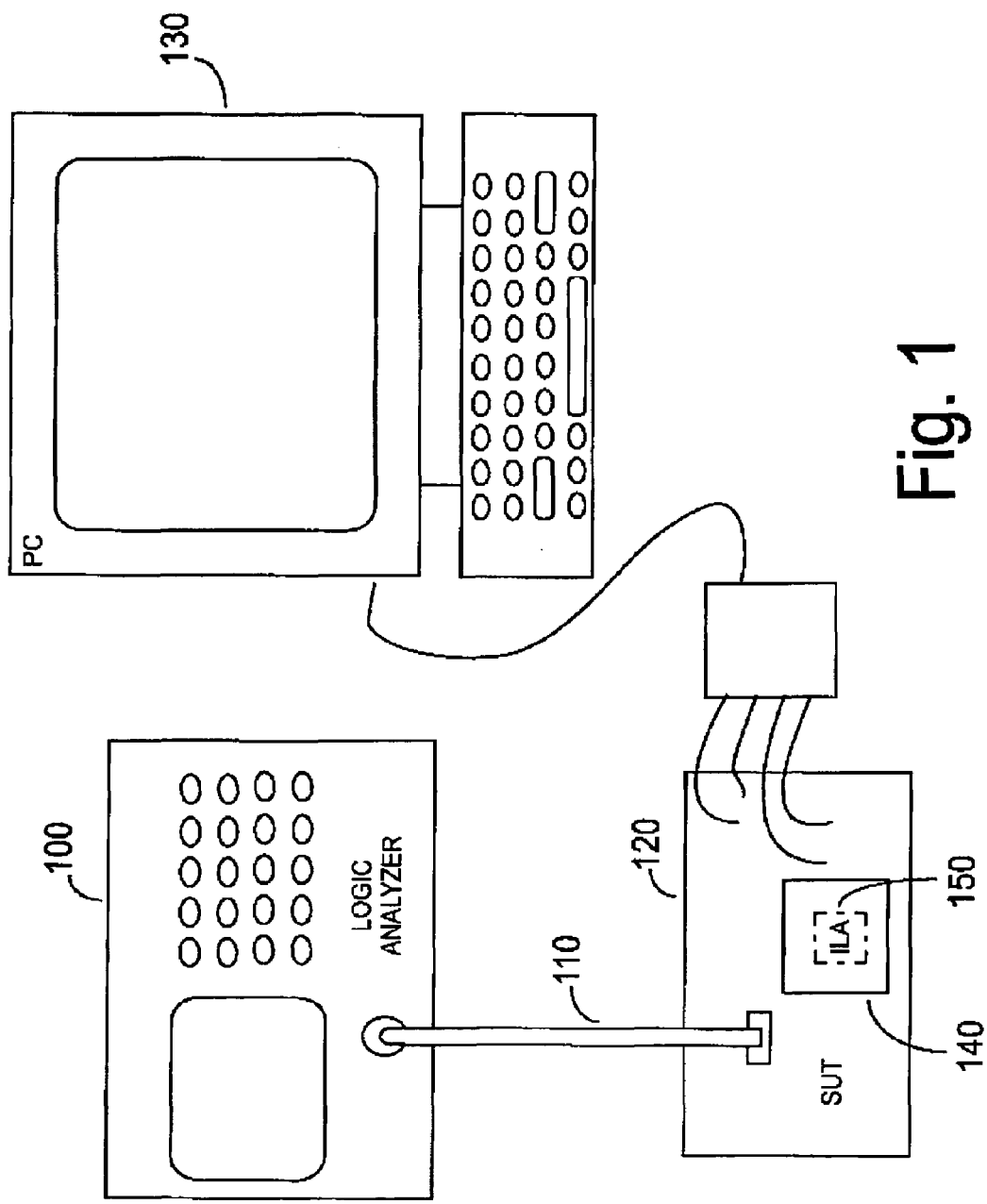
FIG. 1 is a connection diagram for connecting a system under test to a logic analyzer and an ILA, and is useful for understanding the invention.

It is herein recognized that one of the independent logic analysis systems should acquire the acquisition clock signal of the other. This clock signal, in conjunction with the signal from the known reference point, enables a precise timestamp to be associated with each sample from both systems. In doing so, the subject invention also eliminates the declining accuracy for samples removed in time from the reference point that is inherent in Agilent's approach described above.

Referring to FIG. 1, a logic analyzer 100 is coupled to a system under test 120 (also known as a "target system", or simply "target") by a cable and probe arrangement 110 for receiving binary signals corresponding to transactions appearing on the bus of the target system. One skilled in the art will quickly realize that cable and probe arrangement 110 is shown in a highly simplified manner, and in reality, may encompass a multitude of cables and probes coupled to hundreds of test points. The target system 120 includes an FPGA 140 having a Xilinx ILA 150 implemented therein. Xilinx ChipScope™ software may be running on an external computer (i.e., PC) 130 (shown coupled to system under test 120) or may be running on the logic analyzer 100. The ChipScope software provides a user interface to ILA 150, and Xilinx ILA 150 provides a way to "probe" test points within the FPGA.

In addition to all other external signals of interest, logic analyzer 100 acquires two channels of data from the ILA. One of these is connected to the ILA trigger signal, providing a known reference point as noted above, and the other is connected to the ILA clock. By using a logic analyzer clock period of, at most, half of the shortest interval between ILA clock edges, logic analyzer 100 can acquire all ILA clock edges in unique samples. In other words, sampling at this rate ensures that logic analyzer 100 will not miss any clock edge associated with an ILA sample. For example, if the ILA clock period were 100 ns, but its clock signal remained high for only 20 ns, then logic analyzer 100 would have to sample at a rate no less than every 10 ns. Such a rate ensures that logic analyzer 100 sees at least one sample where the ILA clock is low and one where it is high for every ILA clock period. It is then possible to scan through logic analyzer acquisition and locate the samples containing the clock edges corresponding to the ILA samples.

In the same manner, the sample containing the transition of the ILA trigger signal is located and its timestamp determined. Using the trigger timestamp and the timestamps of the logic analyzer samples containing the ILA clock edges, one can calculate timestamps for each of the ILA samples. These timestamps will have a maximum error equal to the logic analyzer's acquisition sample period, and that maximum error will remain constant for all ILA samples. Once the timestamps for each ILA acquisition are calculated, full time-correlation of all logic analyzer and ILA samples can be accurately performed. The time correlated sample record from ILA 150 may be imported to logic analyzer 100 for display along with the logic analyzer's data record.

The example described above utilizes only two acquisition systems, however this technique is equally applicable to any reasonable number of independent acquisition systems. To apply the technique to more than two acquisition systems, one system, in which acquisition samples are time stamped is designated as the master. Acquisition channels from the master system are connected to sample points to acquire a known reference signal (typically the trigger signal) and clock signal from each of the other systems. As above, the master system acquisition clock rate must be at least twice as fast as that of any of the other systems to ensure that no clock edges are missed. Following a completed acquisition, the solution described above is used to compute timestamps for the samples from each of the independent systems such that samples from all of the systems can be time correlated with one another.

While use of a Xilinx ILA was described in the embodiments, one skilled in the art will recognize that the subject invention is not limited that that particular unit, and another similar integrated logic analyzer may be substituted therefor. In fact, the subject invention is not limited to the use of an ILA at all, but rather is equally applicable to any independent test and measurement system, for example, another logic analyzer, an oscilloscope, or any sampling device from which a single reference point and a sample clock can be acquired. These and other similar modifications are deemed to lie within the scope of the following claims.

What is claimed is:

1. A method for time correlating acquisition samples from independent acquisition systems, comprising the steps of:
    coupling a first one of said independent acquisition systems to a system under test for acquiring data samples from said system under test;
    coupling a second one of said independent acquisition systems to said system under test for acquiring data samples from said system under test;
    said first acquisition system acquiring an acquisition clock signal and a signal representative of a reference point in time from said second acquisition system; and
    using said acquired acquisition clock and reference point signal to calculate time stamps associated with said first acquisition system for data acquired by said second acquisition system.

2. An acquisition arrangement for probing a system under test, comprising:
    a first independent acquisition unit coupled to said system under test for acquiring data samples from said system under test;
    a second independent acquisition unit coupled to said system under test for acquiring data samples from said system under test;
    said first acquisition unit acquiring an acquisition clock signal and a signal representative of a reference point in time from said second acquisition unit; and
    using said acquired acquisition clock and reference point signals to calculate time stamps associated with said first acquisition unit for data acquired by said second acquisition unit.

3. The acquisition arrangement of claim 2, wherein:
    said first independent acquisition unit is a logic analyzer; and
    said second independent acquisition unit is an Integrated Logic Analyzer (ILA) for probing internal locations of a Field Programmable Gate Array (FPGA) on said system under test.

4. The acquisition arrangement of claim 3, wherein:
    said signal representative of a reference point in time from said second acquisition unit is a trigger out signal of said ILA.

5. The acquisition arrangement of claim 2, wherein:
    said first independent acquisition unit is a first logic analyzer; and
    said second independent acquisition unit is a second logic analyzer for probing additional signals of said system under test.

6. The acquisition arrangement of claim 5, wherein:
    said signal representative of a reference point in time from said second acquisition unit is a trigger out signal of said second logic analyzer.

7. The acquisition arrangement of claim 2, wherein:
    said first independent acquisition unit is a first logic analyzer; and
    said second independent acquisition unit is an oscilloscope for probing additional signals of said system under test.

8. The acquisition arrangement of claim 7, wherein:
    said signal representative of a reference point in time from said second acquisition unit is a trigger out signal of said oscilloscope.

* * * * *